(12) United States Patent
Tawa et al.

(10) Patent No.: US 12,044,746 B2
(45) Date of Patent: Jul. 23, 2024

(54) INSPECTION APPARATUS, INSPECTION METHOD, INSPECTION PROGRAM, AND ASSEMBLED BATTERY SYSTEM

(71) Applicant: GS Yuasa International Ltd., Kyoto (JP)

(72) Inventors: Hayato Tawa, Kyoto (JP); Daisuke Konishi, Kyoto (JP); Kazuyuki Kawamoto, Kyoto (JP); Jun Ikemoto, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 809 days.

(21) Appl. No.: 17/264,171

(22) PCT Filed: Jun. 28, 2019

(86) PCT No.: PCT/JP2019/025884
§ 371 (c)(1),
(2) Date: Jan. 28, 2021

(87) PCT Pub. No.: WO2020/026663
PCT Pub. Date: Feb. 6, 2020

(65) Prior Publication Data
US 2021/0286020 A1  Sep. 16, 2021

(30) Foreign Application Priority Data
Aug. 3, 2018 (JP) .................. 2018-146541

(51) Int. Cl.
*G01R 31/396* (2019.01)
*G01R 31/3835* (2019.01)
(Continued)

(52) U.S. Cl.
CPC ....... *G01R 31/396* (2019.01); *G01R 31/3835* (2019.01); *H01M 10/4285* (2013.01);
(Continued)

(58) Field of Classification Search
CPC . G01R 31/396; G01R 31/3835; H01M 50/51; H01M 10/48; H01M 10/482; H01M 10/4285
See application file for complete search history.

(56) References Cited

U.S. PATENT DOCUMENTS 5,625,272 A     4/1997  Takahashi
10,181,733 B2 * 1/2019  Jo ........................... B60L 58/22
(Continued)

FOREIGN PATENT DOCUMENTS

JP    H08-140206 A    5/1996
JP    2000-123883 A   4/2000
(Continued)

OTHER PUBLICATIONS

International Search Report (ISR) (PCT Form PCT/ISA/210), in PCT/JP2019/025884, dated Aug. 13, 2019.

*Primary Examiner* — Christopher E Mahoney
(74) *Attorney, Agent, or Firm* — MCGINN I.P. LAW GROUP, PLLC

(57) ABSTRACT

In an inspection apparatus for an assembled battery having a plurality of energy storage devices connected in series, based on a voltage difference between a first energy storage device with the first-lowest voltage and a second energy storage device with the second-lowest voltage during charge or discharge among the plurality of energy storage devices, an abnormality of the first energy storage device is detected.

15 Claims, 11 Drawing Sheets

(51) Int. Cl.
  *H01M 10/42*   (2006.01)
  *H01M 10/44*   (2006.01)
  *H01M 10/48*   (2006.01)
  *H01M 50/51*   (2021.01)
  *H02J 7/00*    (2006.01)

(52) U.S. Cl.
  CPC .......... *H01M 10/44* (2013.01); *H01M 10/48* (2013.01); *H01M 10/482* (2013.01); *H01M 50/51* (2021.01); *H02J 7/0047* (2013.01); *H01M 2220/10* (2013.01); *H01M 2220/20* (2013.01)

(56) References Cited

U.S. PATENT DOCUMENTS

2009/0319208 A1* 12/2009 Kwon .................. H01M 10/48
                                                   702/63
2011/0148426 A1   6/2011 Yokotani

FOREIGN PATENT DOCUMENTS

| JP | 2001095160 A * | 4/2001 | ......... G01R 31/3624 |
| JP | 2002-334726 A | 11/2002 | |
| JP | 2005-114401 A | 4/2005 | |
| JP | 2007-309839 A | 11/2007 | |
| JP | 2010-231939 A | 10/2010 | |
| JP | 2011-135656 A | 7/2011 | |
| JP | 2012-83317 A | 4/2012 | |
| JP | 2012-088097 A | 5/2012 | |
| JP | 2014-29273 A | 2/2014 | |
| JP | 2017-62892 A | 3/2017 | |
| WO | WO-2007097181 A1 * | 8/2007 | .......... H01M 10/441 |
| WO | WO-2021085836 A1 * | 5/2021 | ....... G01R 19/16542 |

\* cited by examiner

INSPECTION APPARATUS, INSPECTION METHOD, INSPECTION PROGRAM, AND ASSEMBLED BATTERY SYSTEM

TECHNICAL FIELD

The present invention relates to a method for detecting an abnormality of an energy storage device.

BACKGROUND ART

An abnormality may occur in an energy storage device. One of the abnormalities is an internal short circuit. The internal short circuit is a short circuit between a positive electrode and a negative electrode inside a battery and is generated, for example, due to contamination with a metal piece or some other reasons. Patent Document 1 discloses the following: in a case where an assembled battery is in a fully charged state, a voltage value of a battery cell is lower than a predetermined value, and a bypass current measured for another battery cell, in which the voltage is maintained, is higher than a predetermined value, it is detected that an internal short circuit has occurred in the battery cell in which a decrease in voltage value has detected.

PRIOR ART DOCUMENT

Patent Document

Patent Document 1: JP-A-2010-231939

SUMMARY OF THE INVENTION

Problems to be Solved by the Invention

In the above method, a bypass circuit and a current measurement device are required for each storage device, and thus the number of components increases as the number of series connections of the energy storage devices increases. As a method for detecting an abnormality of the energy storage device, there is considered, for example, a method in which the voltage of each storage device is measured during charge and a determination is made based on the voltage difference between an energy storage device with the highest voltage and an energy storage device with the lowest voltage. However, when a comparison is made between the energy storage device with the highest voltage and the energy storage device with the lowest voltage, the voltage variation due to the difference in capacity or a state of charge (SOC) between the two storage devices is large, and the variation in the voltage difference is inevitably large. Hence, the abnormality of the energy storage device may not be detected with high accuracy.

The present invention has been made in view of such circumstances as described above, and an object of the present invention is to improve the accuracy in detection of an abnormality for an energy storage device.

Means for Solving the Problems

In an inspection apparatus for an assembled battery having a plurality of energy storage devices connected in series, based on a voltage difference between a first energy storage device with the first-lowest voltage and a second energy storage device with the second-lowest voltage during charge or discharge among the plurality of energy storage devices, an abnormality of the first energy storage device is detected In an inspection method for an assembled battery having a plurality of energy storage devices connected in series, based on a voltage difference between a first energy storage device with the first-lowest voltage and a second energy storage device with the second-lowest voltage during charge or discharge among the plurality of energy storage devices, an abnormality of the first energy storage device is detected.

The above technique can be realized in various aspects such as an inspection program for an assembled battery having a plurality of energy storage devices connected in series and a recording medium in which the inspection program is recorded.

Advantages of the Invention

The abnormality of the energy storage device can be detected with high accuracy.

MODE FOR CARRYING OUT THE INVENTION

Figure 1:
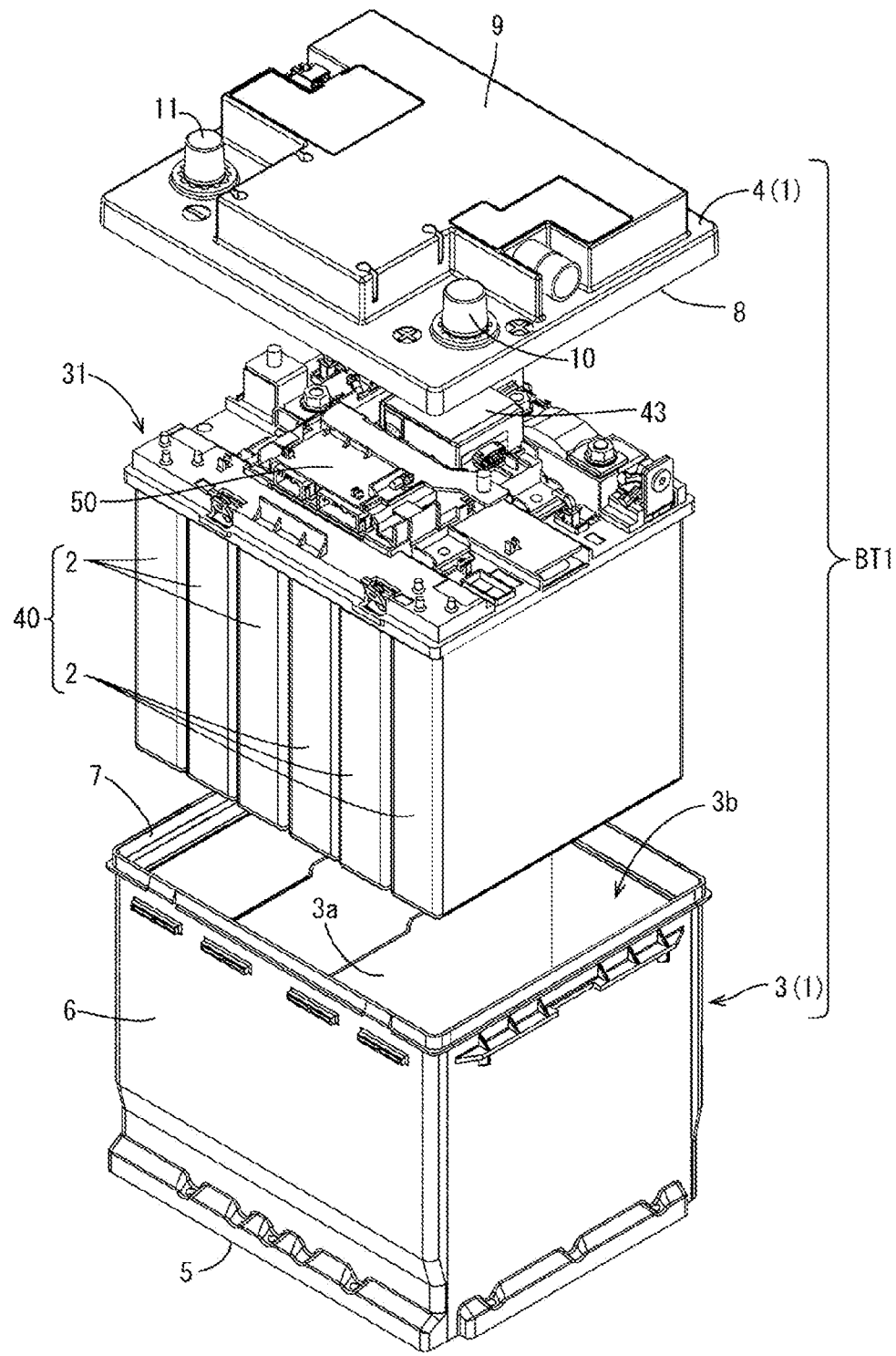
FIG. 1 is an exploded perspective view of a battery according to a first embodiment.

In an inspection apparatus for an assembled battery having a plurality of energy storage devices connected in series, based on a voltage difference between a first energy storage device with the first-lowest voltage and a second energy storage device with the second-lowest voltage during charge or discharge among the plurality of energy storage devices, the occurrence or non-occurrence of an abnormality of the first energy storage device is detected. "During charge or discharge" means during charge or during discharge.

The second energy storage device with the second-lowest voltage has a smaller capacity difference and SOC difference relative to the first energy storage device with first-lowest voltage than the other storage devices. Hence the second energy storage device has smaller voltage variation relative to the first energy storage device. In this configuration, as compared to a case where the abnormality is detected by comparing the voltage of the first energy storage device with the first-lowest voltage with the voltage of the energy storage device with the highest voltage, it is possible to highly accurately detect the occurrence or non-occurrence of the abnormality of the first energy storage device. SOC is a state of charge.

The inspection apparatus may determine that the first energy storage device is abnormal when the abnormality of the first energy storage device is detected both during charge and during discharge. By determining the abnormality of the energy storage device based on the results of detecting the occurrence or non-occurrence of the abnormality both during charge and during discharge, it is possible to prevent erroneous determination of the occurrence or non-occurrence of the abnormality as compared to a case where the occurrence or non-occurrence of the abnormality is determined based only on the result obtained only either during charge or during discharge.

The inspection apparatus preferably detects the abnormality of the first energy storage device based on the number of times that the voltage difference exceeds a first threshold value. This method is effective in detecting an abnormality of the voltage drop caused by a phenomenon in which the positive electrode and the negative electrode repeat contact and non-contact (so-called a soft short circuit) due to a foreign substance such as a metal piece mixed inside the battery. When the assembled battery is used for a moving body, applying this method makes it possible to accurately detect an abnormality of the voltage drop caused by the phenomenon in which the positive electrode and the negative electrode repeat contact and non-contact, such as a soft short circuit that occurs due to the vibration of the moving body. When the assembled battery is used for a moving body, the inspection apparatus may detect the abnormality of the first energy storage device during the discharge of the assembled battery. While the moving body is moving, the assembled battery is discharged for a long time, and vibration due to the movement is easily applied, thereby facilitating the detection.

The moving body may be a ship. The ship is always susceptible to shaking due to waves. By applying this method, it is possible to accurately detect an abnormality of the voltage drop caused by the phenomenon in which the positive electrode and the negative electrode repeat contact and non-contact, such as a soft short circuit that occurs due to the shake of the ship.

In the inspection apparatus, a first detection method and a second detection method may be performed, the first detection method being to detect the abnormality of the first energy storage device based on the number of times that the voltage difference exceeds a first threshold value, the second detection method being to detect the abnormality of the first energy storage device based on duration in which a time change amount of the voltage difference continues to exceed a second threshold value. When the abnormality may be detected by at least one of the first detection method and the second detection method, it may be determined that the first energy storage device is abnormal. An abnormality in a different mode can be detected by using the two detection methods in combination. The inspection apparatus may change the processing content to be performed on the assembled battery in accordance with the detection method by which an abnormality has been detected. For example, when the abnormality is detected by the first detection method (an abnormality caused by a soft short circuit), the charge and discharge of the assembled battery may be prevented, and when the abnormality is detected by the second detection method (an abnormality caused by a hard short circuit), the use of the assembled battery may be prohibited.

The inspection apparatus preferably determines that the first energy storage device is abnormal based on duration in which a time change amount of the voltage difference continues to exceed a second threshold value. This method is effective in detecting an abnormality of the voltage drop caused by a phenomenon in which the positive electrode and the negative electrode are constantly in contact (hard short circuit) due to a foreign substance such as a metal piece mixed inside the battery. When the assembled battery is for stationary use, applying this method makes it possible to accurately detect an abnormality of the voltage drop caused by a hard short circuit in the assembled battery for stationary use.

First Embodiment

1. Description of Structure of Battery BT1

Figure 2:
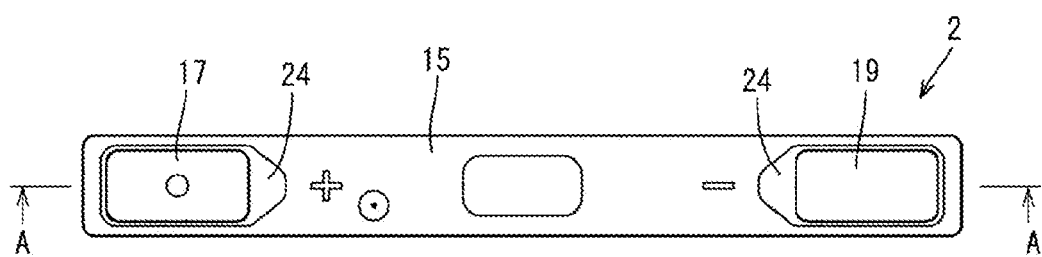
FIG. 2 is a plan view of a secondary battery.
Figure 3:
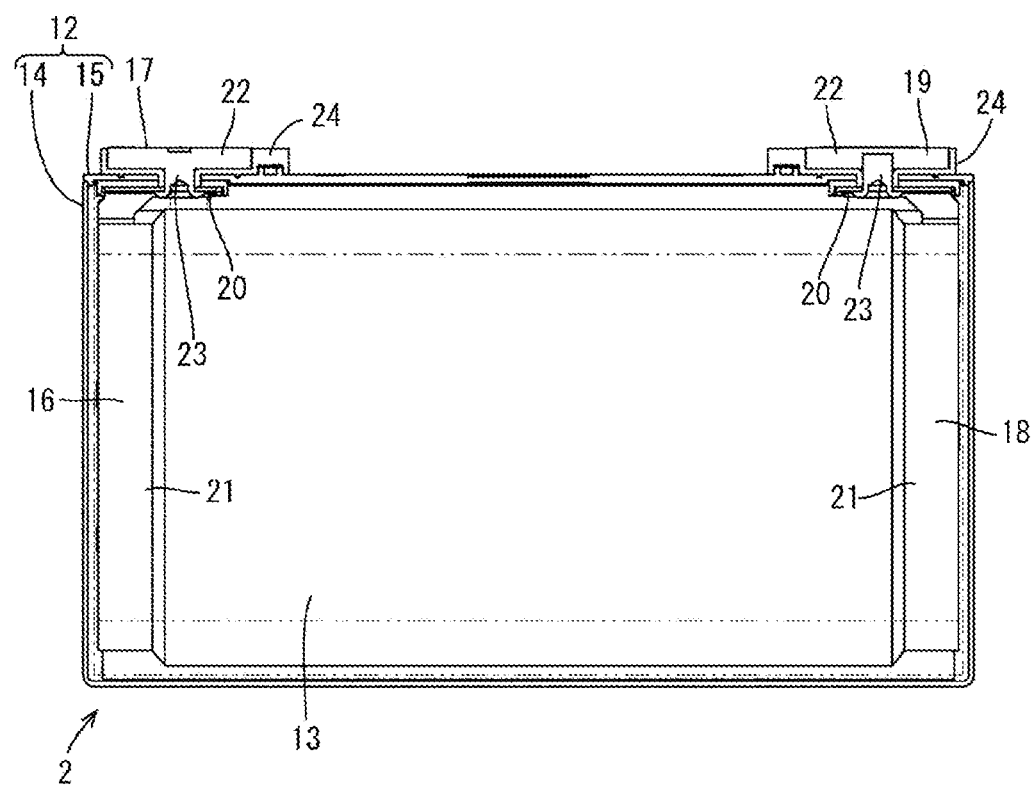
FIG. 3 is a cross-sectional view taken along line A-A in FIG. 2.

FIG. 1 is an exploded perspective view of a battery BT1, FIG. 2 is a plan view of the secondary battery, and FIG. 3 is a cross-sectional view taken along line A-A in FIG. 2. The battery BT1 includes a housing 1, an assembled battery 40 housed inside the housing 1, and a substrate unit 31.

The housing 1 includes a main body 3 made of a synthetic resin material and a lid 4. The main body 3 has a bottomed tubular shape and includes a bottom surface portion 5 having a rectangular shape in plan view and four side surface portions 6 rising from four sides thereof to form a tubular shape. An upper opening 7 is formed in an upper-end portion by the four side surface portions 6.

The lid 4 has a rectangular shape in plan view, and a frame body 8 extends downward from four sides thereof. The lid 4 closes the upper opening 7 of the main body 3. The lid 4 has, on the upper surface, a protrusion 9 having a substantially T-shape in plan view. An external terminal 10 of the positive electrode is fixed to one corner of two locations where the protrusion 9 is not formed on the upper surface of the lid 4, and an external terminal 11 of the negative electrode is fixed to the other corner portion. The housing 1 houses the assembled battery 40 and the substrate unit 31. The substrate unit 31 is disposed above the assembled battery 40.

The assembled battery 40 is made up of a plurality (six as an example) of secondary batteries 2 connected in series. Each secondary battery 2 is housed in each battery housing chamber 3b of the housing 1 partitioned by partition walls 3a. The secondary battery 2 is an example of an energy storage device. As shown in FIGS. 2 and 3, the secondary battery 2 houses an electrode assembly 13 together with a nonaqueous electrolyte in a case 12 having a rectangular parallelepiped shape. The secondary battery 2 is, for example, a lithium ion secondary battery. The case 12 has a case body 14 and a cover 15 that closes an opening at the top of the case body 14.

Although not shown in detail, the electrode assembly 13 has a separator, made of a porous resin film, disposed between a negative electrode element formed by applying an active material to a substrate made of copper foil and a positive electrode element formed by applying an active material to a substrate made of aluminum foil. These are all belt-shaped, and are wound in a flat shape so as to be able to be housed in the case body 14 in a state where the negative electrode element and the positive electrode element are displaced from each other on the opposite sides in the width direction with respect to the separator.

The positive electrode element is connected to a positive electrode terminal 17 via a positive electrode current collector 16, and the negative electrode element is connected to a negative electrode terminal 19 via a negative electrode current collector 18. Each of the positive electrode current collector 16 and the negative electrode current collector 18 is made up of a plate-shaped base 20 and legs 21 extending from the base 20. A through hole is formed in the base 20. The leg 21 is connected to the positive electrode element or the negative electrode element. Each of the positive electrode terminal 17 and the negative electrode terminal 19 is made up of a terminal main body portion 22 and a shaft 23 protruding downward from the center portion of the lower surface of the terminal main body portion 22. The terminal main body portion 22 and the shaft 23 of the positive electrode terminal 17 are integrally formed of aluminum (single material). In the negative electrode terminal 19, the terminal main body portion 22 is made of aluminum, the shaft 23 is made of copper, and these are assembled. The terminal main body portions 22 of the positive electrode terminal 17 and the negative electrode terminal 19 are arranged at both ends of the cover 15 via gaskets 24 made of an insulating material and are exposed to the outside from the gaskets 24.

2. Electrical Configuration of Battery BT1 and Inspection Apparatus

Figure 4:
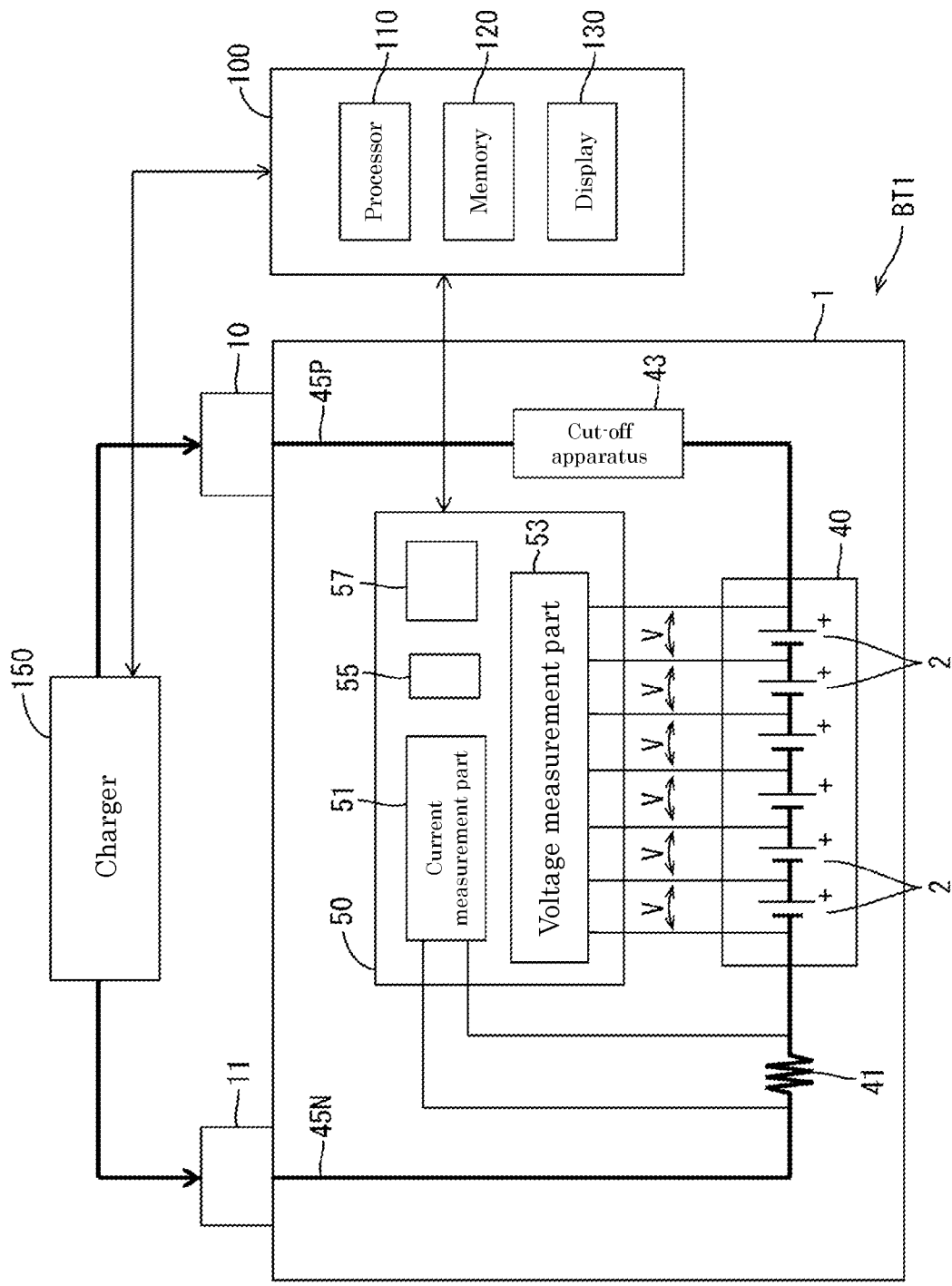
FIG. 4 is a block diagram showing an electrical configuration of a battery and an inspection apparatus.

FIG. 4 is a block diagram showing the electrical configuration of the battery BT1 and an inspection apparatus 100. The battery BT1 includes an assembled battery 40, a current detection resistor 41, a cut-off apparatus 43, and a measurement unit 50.

The current detection resistor 41, the assembled battery 40, and the cut-off apparatus 43 are connected in series via power lines 45P, 45N. The power line 45P is a power line for connecting the external terminal 10 of the positive electrode and the positive electrode of the assembled battery 40. The power line 45N is a power line for connecting the external terminal 11 of the negative electrode and the negative electrode of the assembled battery 40. The cut-off apparatus 43 is located on the positive electrode side of the assembled battery 40 and provided on the power line 45P on the positive electrode side. The current detection resistor 41 is located on the negative electrode side of the assembled battery 40 and provided on the power line 45N of the negative electrode.

The cut-off apparatus 43 can be made of a contact switch (mechanical type) such as a relay, or a semiconductor switch such as a field-effect transistor (FET) or a transistor. A current I can be cut off by operating the cut-off apparatus 43.

The measurement unit 50 includes a current measurement part 51, a voltage measurement part 53, a memory 55, and a communicator 57. The measurement unit 50 is provided on a substrate unit 31. The current measurement part 51 measures the current of the battery BT1 based on the voltage across the current detection resistor 41. The voltage measurement part 53 measures a voltage V of each secondary battery 2 constituting the assembled battery 40 and a total voltage Vt of the assembled battery 40. The total voltage Vt is the total voltage of the six secondary batteries 2. The current measurement part 51 can distinguish between charge and discharge from the polarity (positive or negative) of the voltage across the current detection resistor 41.

The memory 55 is used for backing up data of the current measured by the current measurement part 51 and data of the voltage V of each secondary battery 2 measured by the voltage measurement part 53.

The communicator 57 is used for communicating with a monitoring apparatus (not shown) and the inspection apparatus 100 provided outside the battery BT1. The monitoring apparatus is an apparatus for monitoring the state of the battery BT1.

The inspection apparatus 100 is provided with a processor 110, a memory 120, and a display 130. An inspection apparatus 100 detects the occurrence or non-occurrence an internal short circuit for a plurality of secondary batteries 2 connected in series in an inspection step at the time of shipment. The internal short circuit is an abnormality in which a positive electrode element and a negative electrode element contact each other inside the case 12.

The memory 120 is a non-volatile storage medium such as flash memory or an electrically erasable programmable read-only memory (EEPROM). The memory 120 stores an inspection program for detecting an abnormality of the assembled battery 40 and various pieces of data for executing the inspection program. The inspection program is a program for detecting the occurrence or non-occurrence an internal short circuit for a plurality of secondary batteries 2 connected in series by causing the processor 110, which is a computer, to execute detection processing for an internal short circuit (S10 to S70 in FIG. 5).

3. Detection of Internal Short Circuit

Figure 5:
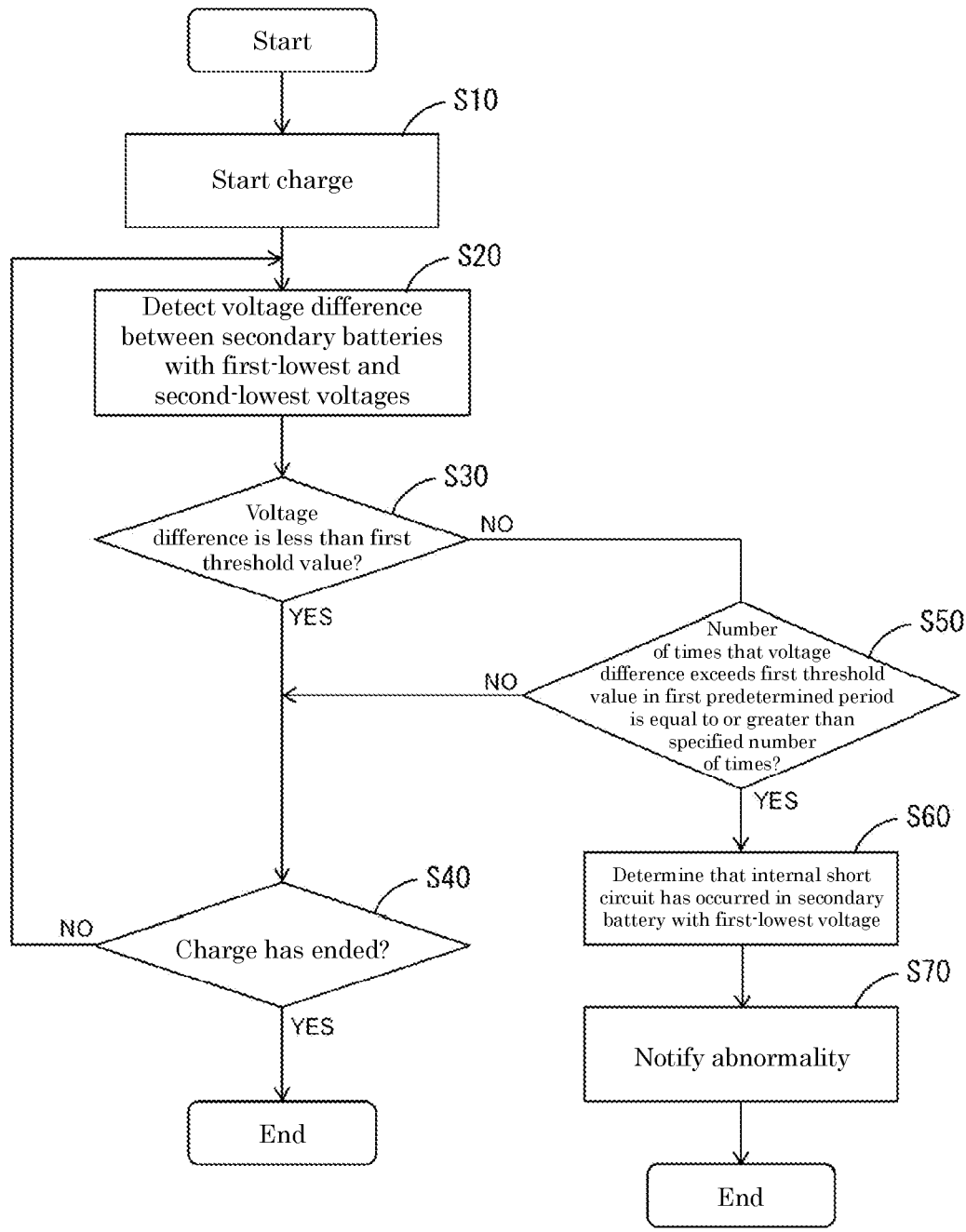
FIG. 5 is a flowchart of detection processing for an internal short circuit.

FIG. 5 is a flowchart of the detection processing for an internal short circuit. The inspection processing for an internal short circuit is performed in an inspection step at the time of shipment of the battery BT1 and is made up of seven steps of S10 to S70.

In the inspection step, first, as shown in FIG. 4, the charger 150 is connected to the external terminals 10, 11 of the battery BT1, and the charge of the battery BT1 is started (S10). The charge is a constant current charge. The charge may be a constant power charge. When the charge of the battery BT1 is started, the current measurement part 51 starts measuring the charging current, and the voltage measurement part 53 starts measuring the voltage V of each secondary battery 2 connected in series and the total voltage Vt of the assembled battery 40.

Each data measured by the measurement unit 50 is transmitted from the measurement unit 50 to the inspection apparatus 100 in real time. Each data is data of the charging current measured by the current measurement part 51, and data of the voltage V of each secondary battery 2 and the total voltage Vt of the assembled battery 40 measured by the voltage measurement part 53.

The processor 110 extracts a secondary battery (first energy storage device) 2 with the first-lowest voltage and a secondary battery (second energy storage device) 2 with the second-lowest voltage during charge, based on the data transmitted from the measurement unit 50 in real time. The processor 110 calculates a voltage difference ΔV between the two secondary batteries 2 with the first-lowest and second-lowest voltages (S20).

$$\Delta V = V2 - V1 \tag{1}$$

V2 is the voltage of the secondary battery with the second-lowest voltage among the six secondary batteries 2 connected in series, and V1 is the voltage of the secondary battery with the first-lowest voltage.

Next, the processor 110 compares the voltage difference ΔV between the two secondary batteries 2 with a first threshold value K1 (S30). When the voltage difference ΔV is less than the first threshold value K1, the processor 110 determines that the assembled battery 40 is normal. In this case, the processing flow shifts to S40, and the processor 110 performs processing of determining whether the charge has ended. When the charge has not ended, the processor 110 detects the voltage difference ΔV again in S20, and then compares the voltage difference ΔV with the first threshold value K1 in S30.

When the voltage difference ΔV between the two secondary batteries 2 exceeds the first threshold value K1, the processor 110 determines whether the number of times that the voltage difference ΔV exceeds the first threshold value K1 within a first predetermined period T1 is equal to or greater than a prescribed number of times (S50). When the number of times that the voltage difference ΔV exceeds the prescribed number of times within the first predetermined period T1 (S50: YES), the processor 110 determines that an internal short circuit has occurred in the secondary battery 2 with the first-lowest voltage (S60).

The first predetermined time T1 is, for example, ten seconds, and the prescribed number of times is, for example, three. The first threshold value K1 is, for example, 20 to 40 mV.

When it is determined that an internal short circuit has occurred in the secondary battery 2 with the first-lowest voltage, the processor 110 performs processing of making a notification of the abnormality (S70). For example, the processor 110 sends a command to stop the charge to the charger 150 and causes the display 130 to display an error message such as "Internal short circuit has occurred in secondary battery 2".

Even when the voltage difference ΔV between the two secondary batteries 2 exceeds the first threshold value K1, so long as the number of times within the first predetermined period T1 is less than the prescribed number of times, the processor 110 determines that the assembled battery 40 is normal (determines NO in S50). In this case, the charge is continued. When the charge ends, the detection processing for an internal short circuit also ends (S40).

Figure 6:
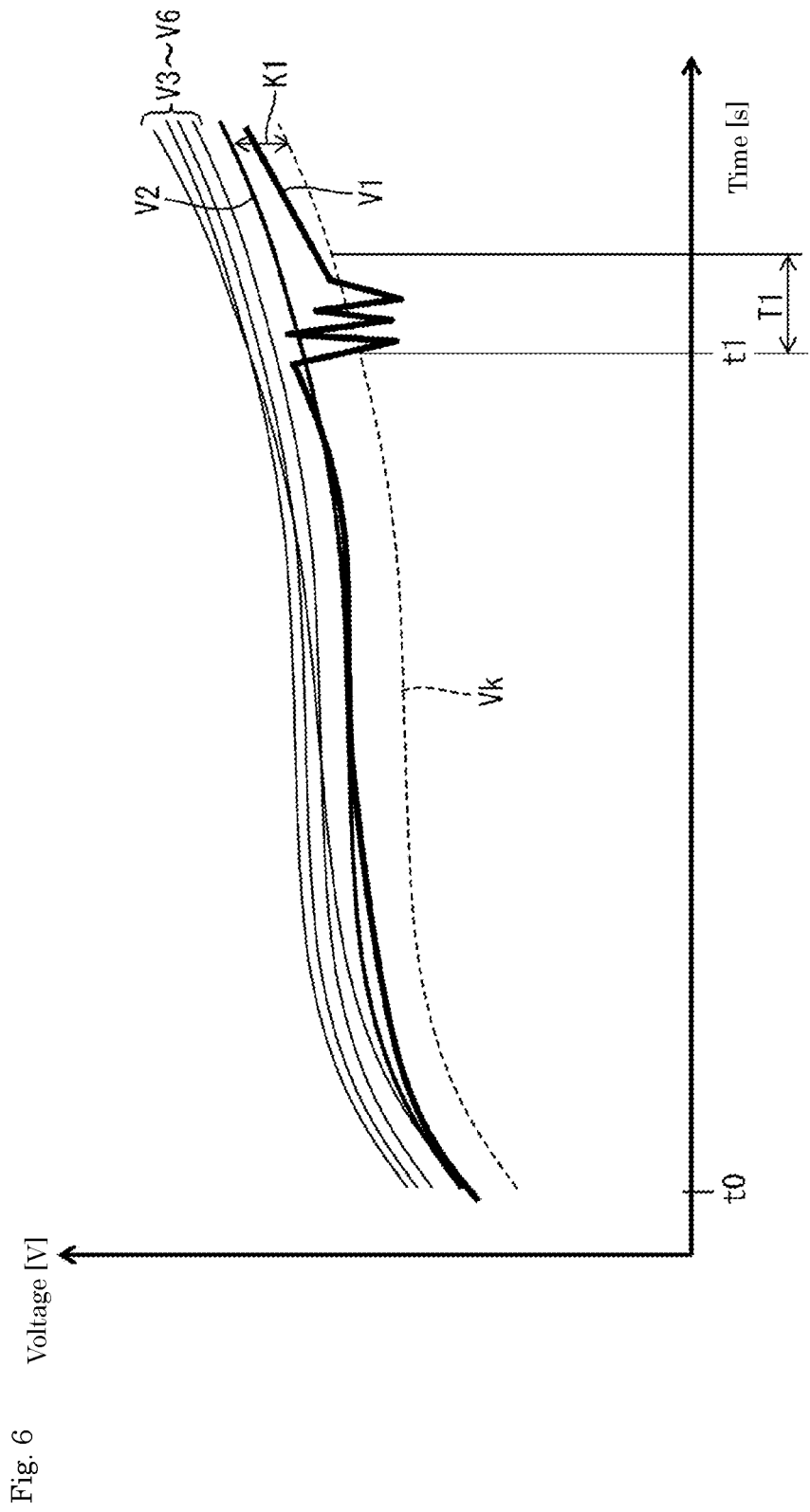
FIG. 6 is a voltage waveform of each secondary battery during charge.

FIG. 6 shows voltage waveforms V1 to V6 of the respective secondary batteries 2 when the assembled battery 40 is charged with a constant current, the horizontal axis represents time [s], and the vertical axis represents voltage [V]. FIG. 6 shows the voltage waveform of the secondary battery 2 with the first-lowest voltage as V1 and the voltage waveform of the secondary battery 2 with the second-lowest voltage as V2. The voltage waveforms V3 to V6 are the voltage waveforms of the other secondary batteries 2. A voltage waveform Vk indicated by a broken line shows a voltage obtained by subtracting the first threshold value K1 from the voltage waveform V2.

After the charge is started at time t0, the voltage waveform V1 crosses the voltage waveform Vk at time t1, and the voltage difference ΔV from the voltage waveform V2 exceeds the first threshold value K1. During the first predetermined period T1 from the period from time t1, the voltage difference ΔV between the voltage waveform V1 and the voltage waveform V2 exceeds the first threshold value K1 three times, which is the prescribed number of times. Therefore, the inspection apparatus 100 determines that an internal short circuit has occurred in the secondary battery 2 with the first-lowest voltage in the assembled battery 40 (first detection method).

The first detection method is to determine the occurrence or non-occurrence of the abnormality of the secondary battery 2 with the first-lowest voltage based on the voltage difference ΔV between the secondary battery 2 with the first-lowest voltage and the secondary battery 2 with the second-lowest voltage. This is based on the assumption that even when an internal short circuit occurs in one secondary battery (i.e., the secondary battery with the first-lowest voltage) 2, the other secondary batteries 2 are normal. This assumption is based on the fact from the past experience that internal short circuits extremely rarely occur simultaneously in a plurality of secondary batteries 2 constituting the assembled battery 40.

4. Description of Effects

The secondary battery 2 with the second-lowest voltage usually (at the normal time) has a smaller capacity difference and SOC difference relative to the secondary battery 2 with the first-lowest voltage than the other secondary batteries 2, such as the secondary battery with the third or fourth lowest voltage. Therefore, the secondary battery 2 with the second-lowest voltage has small voltage variation relative to the secondary battery 2 with the first-lowest voltage.

In this method, the voltage of the secondary battery 2 with the first-lowest voltage is compared with the voltage of the secondary battery 2 with the second-lowest voltage to determine the occurrence or non-occurrence of the abnormality of the secondary battery 2 with the first-lowest voltage is detected. In this method, it is possible to highly accurately detect an abnormality of the secondary battery 2 with the first-lowest voltage as compared to a case where the voltage of the secondary battery 2 with the first-lowest voltage is compared with the voltages of the other secondary batteries 2 except for the secondary battery 2 with the second-lowest voltage.

When the number of times that the voltage difference ΔV exceeds the first threshold value K1 is equal to or greater than the prescribed number of times within the first predetermined period T1, the inspection apparatus 100 determines that an internal short circuit has occurred in the secondary battery 2 with the first-lowest voltage (abnormality detection). This detection method is effective in detecting an abnormality of the voltage drop of the battery caused by a repetition of contact and non-contact between the positive electrode element and the negative electrode element (soft short circuit) due to a foreign substance such as a metal piece mixed inside the case 12 of the secondary battery 2. In particular, when the battery BT1 is mounted on a moving body such as a vehicle or a ship, applying this method makes it possible to accurately detect an abnormality of the voltage drop caused by the phenomenon in which the positive electrode element and the negative electrode element repeat contact and non-contact, such as a soft short circuit that occurs due to the vibration of the moving body.

Second Embodiment

A second embodiment is similar to the first embodiment in that the abnormality of the secondary battery 2 with the first-lowest voltage is detected by focusing on the voltage difference ΔV between the secondary battery 2 with the first-lowest voltage and the secondary battery 2 with the second-lowest voltage. The second embodiment is different from the first embodiment in the processing of detecting an abnormality from the voltage difference ΔV.

Figure 7:
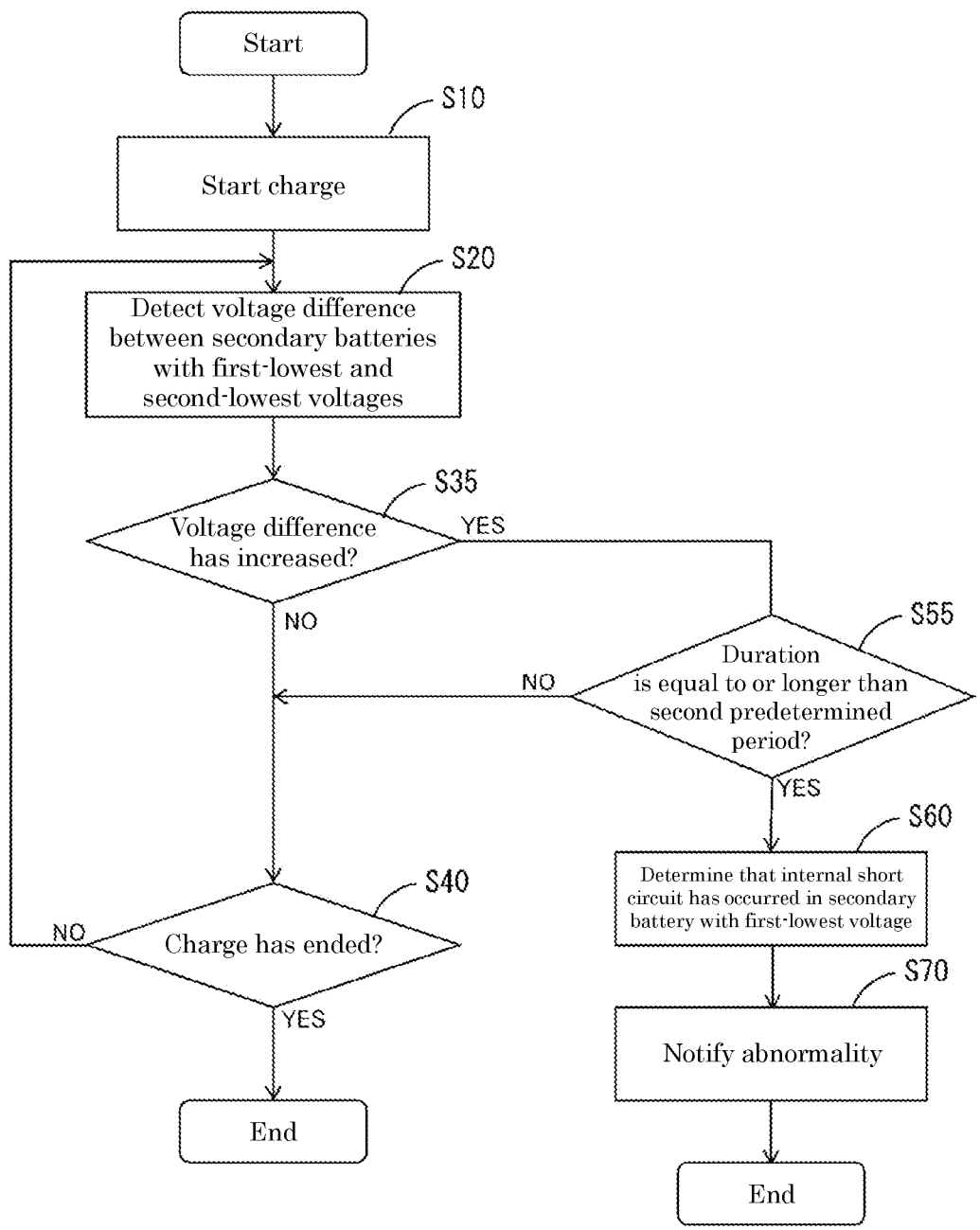
FIG. 7 is a flowchart of detection processing for an internal short circuit according to the second embodiment.

FIG. 7 is a flowchart of the detection processing for an internal short circuit. The detection processing of FIG. 7 is different in S30 and S50 from the detection processing of FIG. 5, and instead of S30 and S50, S35 and S55 are performed.

After the charge is started, the processor 110 extracts the secondary battery 2 with the first-lowest voltage and the secondary battery 2 with the second-lowest voltage and calculates the voltage difference ΔV between the two secondary batteries 2 with the first-lowest and second-lowest voltages (S20). Thereafter, the processor 110 determines whether the voltage difference ΔV between the two secondary batteries 2 has increased with time during charge (S35). When the voltage difference ΔV has not increased (S35: NO), the processor 110 determines that the assembled battery 40 is normal.

When the voltage difference ΔV has increased (S35: YES), the processor 110 determines whether duration T, in which a time change amount ΔV/t of the voltage difference ΔV continues to exceed a second threshold value K2, is equal to or longer than a second predetermined period T2 (S55).

When the duration T is equal to or longer than the second predetermined period T2 (S55: YES), the processor 110 determines that an internal short circuit has occurred in the secondary battery 2 with the first-lowest voltage (S60). When the duration T is shorter than the second predetermined period T2 (S55: NO), the processor 110 determines that the assembled battery 40 is normal. The second predetermined time T2 is, for example, five minutes, and the second threshold value K2 is, for example, 10 mV/min.

Figure 8:
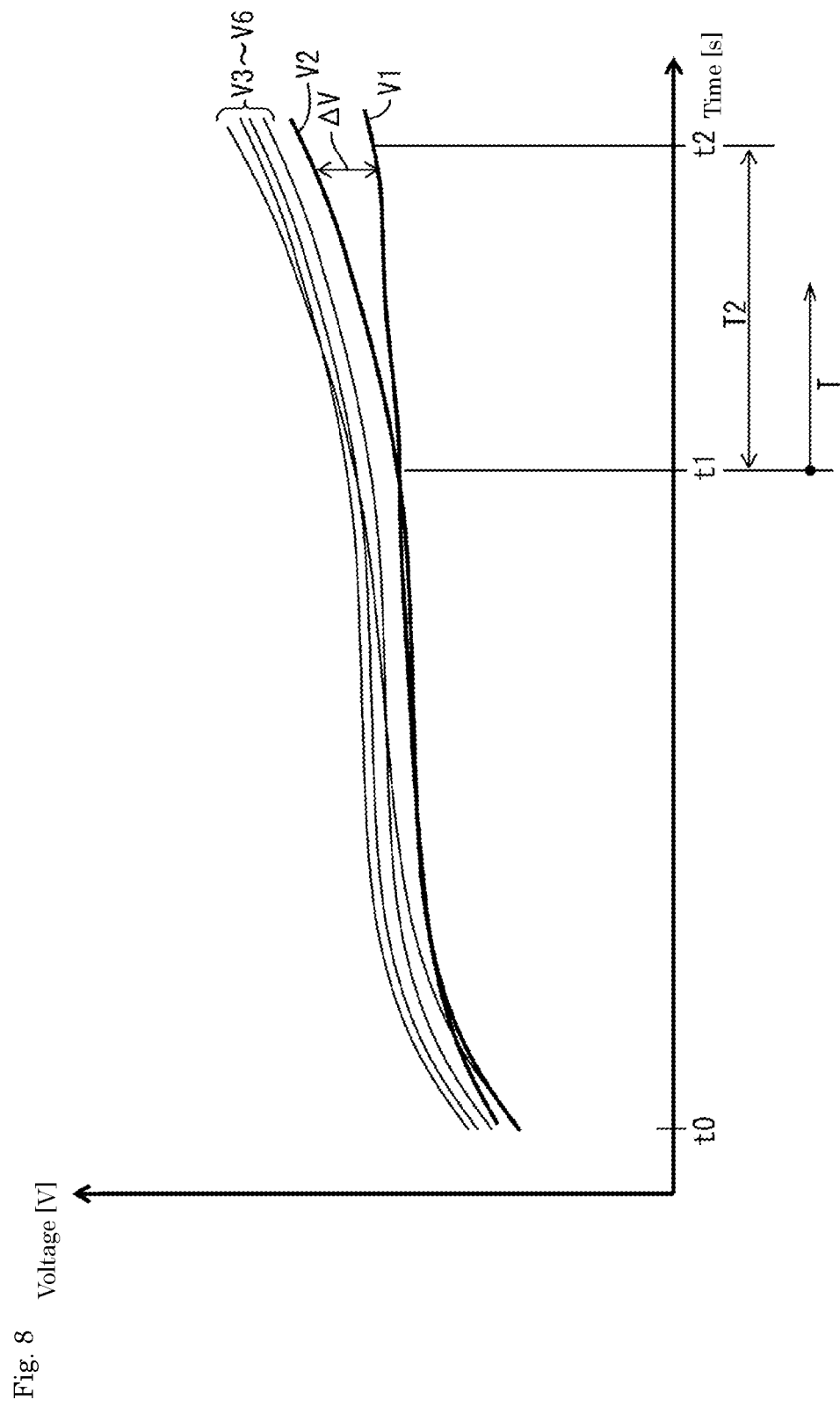
FIG. 8 is a voltage waveform of each secondary battery during charge.

FIG. 8 shows voltage waveforms V1 to V6 of the respective secondary batteries 2 when the assembled battery 40 is charged with a constant current, the horizontal axis represents time [s], and the vertical axis represents voltage [V]. FIG. 8 shows a voltage waveform of the secondary battery 2 with the first-lowest voltage as V1, and a voltage waveform of the secondary battery 2 with the second-lowest voltage as V2. The voltage waveforms V3 to V6 are the voltage waveforms of the other secondary batteries 2.

After the charge is started at time to, the voltage difference ΔV between the voltage waveform V1 and the voltage waveform V2 increases from time t1. After time t1, the time change amount ΔV/t of the voltage difference ΔV continuously exceeds the second threshold value K2. The duration T in which the time change amount ΔV/t continues to exceed the second threshold value K2 reaches the second predetermined period T2 at time t2. Therefore, the inspection apparatus 100 determines that at time t2, an internal short circuit has occurred in the secondary battery 2 with the first-lowest voltage in the assembled battery 40 (second detection method).

The second detection method is effective in detecting an abnormality of the voltage drop of the battery caused by a phenomenon in which the positive electrode element and the negative electrode element are constantly in contact (so-called a hard short circuit) due to a foreign substance such as a metal piece mixed inside the case 12 of the secondary battery 2. That is, when the positive electrode element and the negative electrode element are constantly in contact, an energy loss continues to occur at the contact portion. Therefore, when a hard short circuit occurs between the electrode elements during charge, the voltage difference ΔV then increases, and a state in which the time change amount ΔV/t of the voltage difference ΔV exceeds the second threshold value K2 continues, so that the detection by this method is effective. When the assembled battery 40 is used for stationary use, such as an energy storage apparatus of an uninterruptible power supply system, applying this method makes it possible to accurately detect an abnormality of the voltage drop caused by a hard short circuit in the assembled battery 40 for stationary use.

Other Embodiments

The present invention is not restricted to the embodiments described above and the drawings, but, for example, the following embodiments are included in the technical scope of the present invention.

(1) In the first and second embodiments, the energy storage device has exemplified the secondary battery 2. The energy storage device is not limited to the secondary battery 2 but may be a capacitor or the like. The energy storage device is not limited to a case where a plurality of energy storage devices are connected in series, but the energy storage devices may be connected in series and parallel. The use of the battery BT1 is not limited to a specific use. The battery BT1 can be used for various uses such a use for a moving body (a vehicle, a ship, an automatic guided vehicle (AGV), etc.) and a stationary use (an energy storage apparatus for an uninterruptible power supply system or a photovoltaic power generation system).

Figure 9:
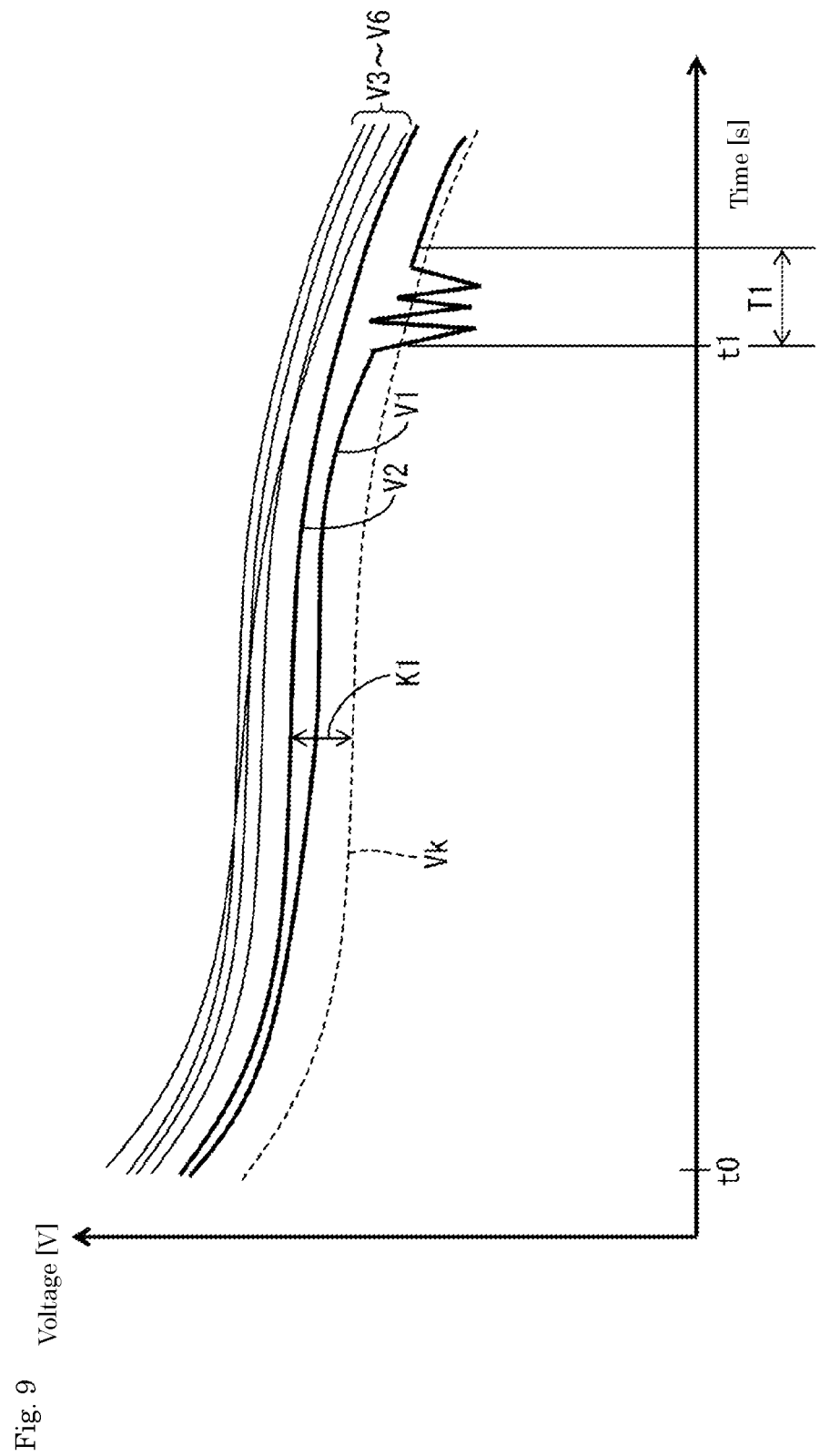
FIG. 9 is a voltage waveform of each secondary battery during discharge.
Figure 10:
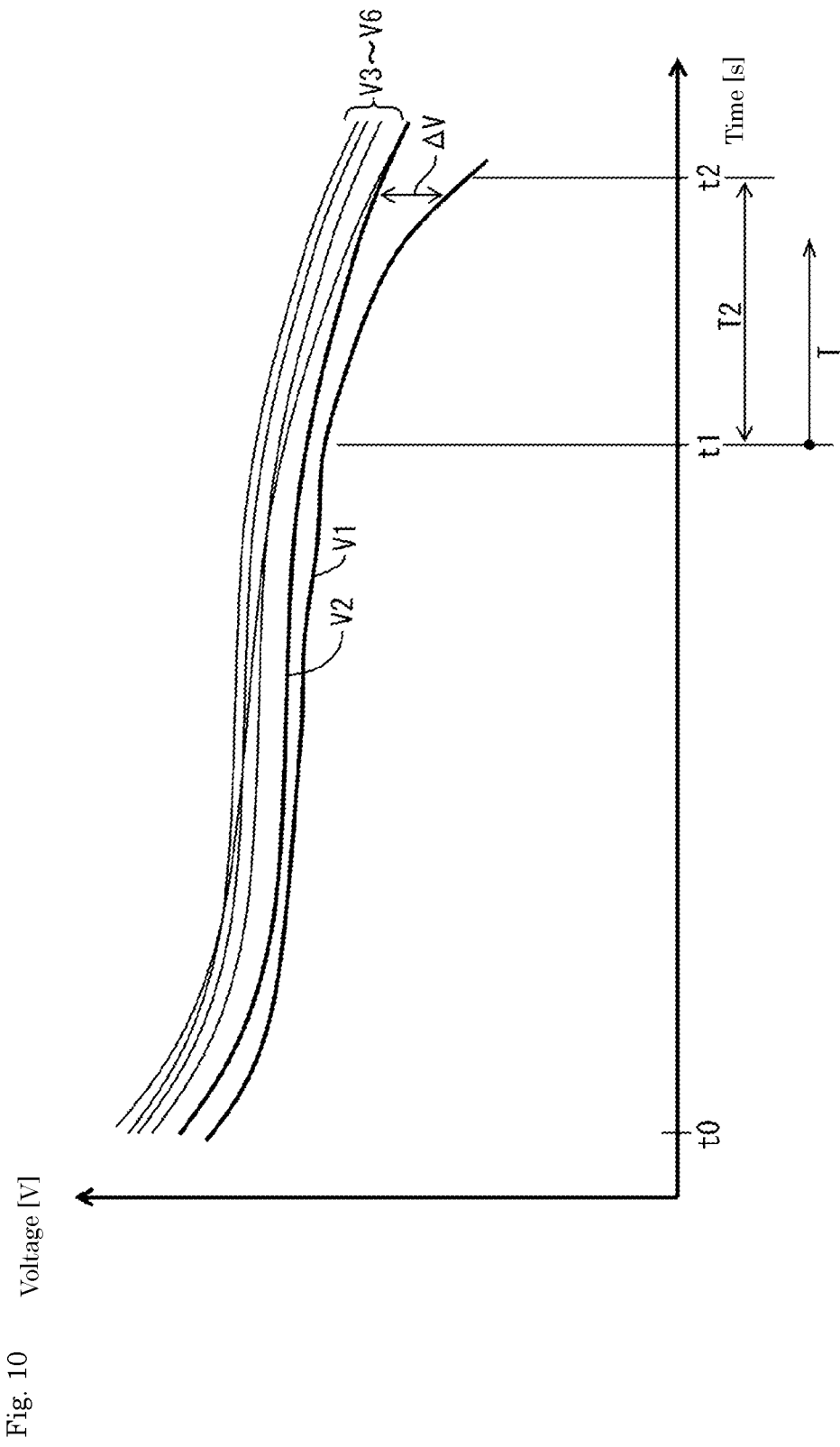
FIG. 10 is a voltage waveform of each secondary battery during discharge.

(2) In the first and second embodiments, the processor 110 has calculated the voltage difference ΔV between the two secondary batteries 2 with the first-lowest and second-lowest voltages from the measured voltage value during charge and detected an internal short circuit of the secondary battery 2 based on the calculated voltage difference ΔV. As shown in FIGS. 9 and 10, also during discharge, the voltage of the secondary battery 2 in which an internal short circuit has occurred is lower than that of the other secondary batteries 2, resulting in the generation of the voltage difference ΔV. Therefore, the battery BT1 may be discharged in shipping inspection, and the processor 110 may calculate the voltage difference ΔV between the two secondary batteries 2 with the first-lowest and second-lowest voltages from a measured voltage value during discharge and may detect the internal short circuit of the secondary battery 2 with the first-lowest voltage based on the calculated voltage difference ΔV.

(3) The processor 110 may detect the voltage difference ΔV between the two secondary batteries 2 with the first-lowest and second-lowest voltages both during charge and during discharge, and may determine that the secondary battery 2 with the first-lowest voltage is abnormal when the abnormality of the secondary battery 2 with the first-lowest voltage is detected both during charge and during discharge. By determining the abnormality of the secondary battery 2 based on the results of detecting the occurrence or non-occurrence of an abnormality both during charge and discharge, it is possible to prevent erroneous determination of the occurrence or non-occurrence of an abnormality as compared to a case where the occurrence or non-occurrence of the abnormality is determined based only on the result obtained only either during charge or during discharge. The first detection method shown in the first embodiment or the second detection method shown in the second embodiment may be used for detecting the abnormality of the secondary battery 2.

(4) In the first and second embodiments, the inspection apparatus 100 for shipment inspection has been shown. The inspection apparatus 100 is not limited to the shipment inspection. The inspection apparatus 100 may be mounted on a moving body such as a vehicle or a ship together with the battery BT1 to detect the abnormality of the battery BT1 after the mounting on the moving body. The inspection apparatus 100 may also be incorporated into an uninterruptible power supply system or a photovoltaic power generation system to detect an abnormality of an accumulator in the uninterruptible power supply system or the photovoltaic power generation system while the system is in operation.

(5) When the battery BT1 is mounted on the moving body, it is preferable to detect an abnormality due to a soft short circuit during discharge. That is, during the discharge of the battery BT1 mounted on the moving body, the processor 110 preferably calculates the voltage difference ΔV between the two secondary batteries 2 with the first-lowest and second-lowest voltages and detects an abnormality due to a soft short circuit of the battery BT1 mounted on the moving body from the number of times that the voltage difference ΔV exceeds the first threshold value K1. While the moving body is moving, the battery BT1 is discharged for a long time, and vibration due to the movement is easily applied, thereby facilitating the detection.

(6) In the first embodiment, when the number of times that the voltage difference ΔV between the two secondary batteries 2 with the first-lowest and second-lowest voltages exceeds the first threshold value K1 becomes equal to or greater than the prescribed number of times within the first predetermined period T1, the processor 110 has determined the occurrence of an internal short circuit in the secondary battery 2 with the first-lowest voltage. In addition, in a case where the time from the start of charge to the end of charge is counted as one time, when the number of times that the voltage difference ΔV exceeds the first threshold value K1 becomes equal to or more than the predetermined number of times during one-time charge, the processor 110 may determine that an internal short circuit has occurred in the secondary battery 2 with the first-lowest voltage.

(7) In the first embodiment, the processor 110 has detected an internal short circuit of the secondary battery 2 with the first-lowest voltage based on the number of times that the voltage difference ΔV between the two secondary batteries 2 with the first-lowest and second-lowest voltages exceeds the first threshold value K1. Various methods can be applied to the detection of an internal short circuit so long as the detection is performed based on the voltage difference ΔV between the two secondary batteries 2 with the first-lowest and second-lowest voltages. For example, the processor 110 may compare the voltage difference ΔV with the first threshold value K1 and determine that an internal short circuit has occurred in the secondary battery 2 with the first-lowest voltage when the voltage difference ΔV exceeds the first threshold value K1 even once.

(8) In the first embodiment, the abnormality of the secondary battery 2 has been detected by the first detection method. In the second embodiment, the abnormality of the secondary battery 2 has been detected by the second detection method. The first detection method detects the voltage of each secondary battery 2 during charge or during discharge. The first detection method detects the abnormality of the secondary battery 2 based on the number of times that the voltage difference ΔV between the two secondary batteries 2 with the first-lowest and second-lowest voltages exceeds the first threshold value K1 (detection processing in FIG. 5). The first detection method is suitable for detecting an abnormality due to a soft short circuit of the secondary battery 2. The second detection method detects the voltage of each secondary battery 2 during charge or during discharge. The second detection method detects the abnormality of the secondary battery 2 based on the time change amount ΔV/t of the voltage difference ΔV between the two secondary batteries 2 with the first-lowest and second-lowest voltages (detection processing in FIG. 7). The second detection method is suitable for detecting an abnormality due to a hard short circuit of the secondary battery 2.

The processor 110 may detect the abnormality of the secondary battery 2 by using the two detection methods, a first detection method and a second detection method, in combination. When detecting an abnormality by at least one of the two detection methods (when determining that an internal short circuit has occurred), the processor 110 may perform processing of making a notification of an abnormality. The processor 110 can use the two detection methods in combination to detect an abnormality caused by either a soft short circuit mode or a hard short circuit mode. The processor 110 may change the processing content to be performed on the battery BT1 in accordance with the detection method by which an abnormality has been detected. For example, the processor 110 may perform processing of preventing the charge and discharge of the battery BT1 when detecting an abnormality by the first detection method (an abnormality due to a soft short circuit), and may perform processing of prohibiting the use of the battery BT1 when detecting an abnormality by the second detection method (an abnormality due to a hard short circuit).

Figure 11:
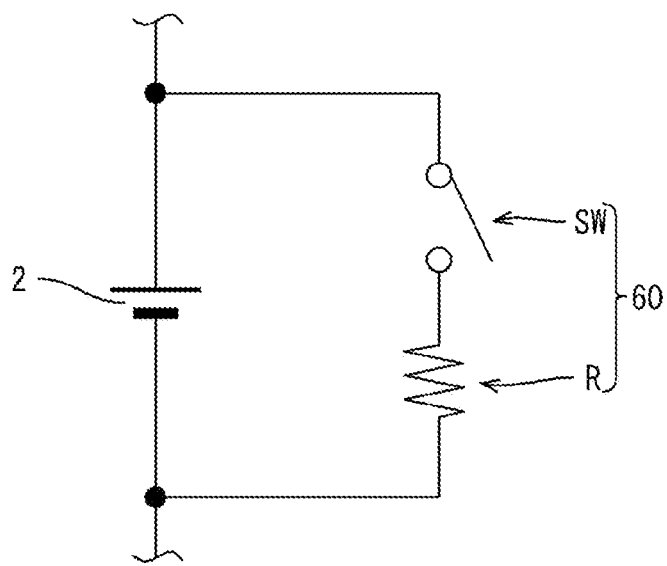
FIG. 11 is a circuit diagram of a balancer circuit.

(9) In the first and second embodiments, the processor 110 has detected the abnormality of the secondary battery 2 caused by an internal short circuit, but when the abnormality is a voltage drop, the cause may be other than an internal short circuit. For example, as shown in FIG. 11, there is a case where a balancer circuit 60 is connected to each of the secondary batteries 2. The balancer circuit 60 has a resistor R and a switch SW, and by turning on the switch SW, the secondary battery 2 is discharged resistively. The balancer circuit 60 discharges the high-voltage secondary battery 2 to equalize the voltages of the secondary batteries 2 connected in series. When the switch SW of the balancer circuit 60 is fixed to ON, the secondary battery 2 is discharged, and its voltage drops. Therefore, the voltage difference ΔV between the secondary battery 2 with the first-lowest voltage and the secondary battery 2 with the second-lowest voltage becomes larger than the normal time. The processor 110 can detect not only an internal short circuit but also a failure of the balancer circuit 60 by the first detection method and the second detection method.

Figure 12:
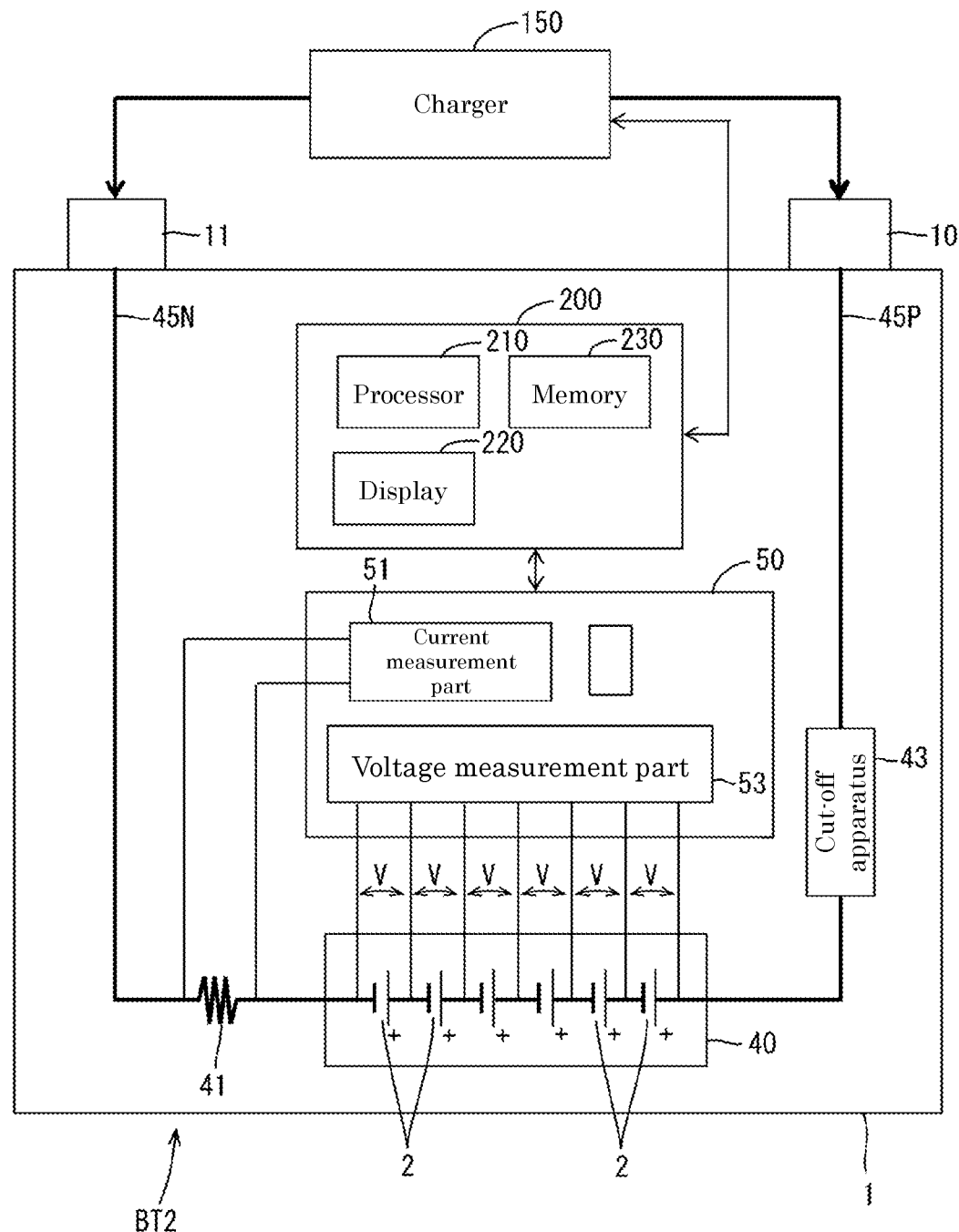
FIG. 12 is a block diagram showing an electrical configuration of a battery in another embodiment.

(10) A battery BT2 in FIG. 12 includes a management apparatus 200. The management apparatus 200 is inside the battery BT2 and includes a processor 210, a display 220, and a memory 230. The management apparatus 200 manages and monitors the state of the battery BT2 based on the voltage data and the current data of each secondary battery 2 measured by the measurement unit 50. The management apparatus 200 calculates the voltage difference ΔV between the two secondary batteries 2 with the first-lowest and second-lowest voltages from the measured voltage values during charge or discharge and detects the abnormality of the secondary battery 2 based on the calculated voltage difference ΔV. In the first and second embodiments, the configuration in which the inspection apparatus 100 is provided separately from the battery BT1 has been exemplified, but the management apparatus 200 inside the battery may be used as the inspection apparatus.

(11) The concept of the present technique can be applied to an inspection program for an assembled battery having a plurality of energy storage devices connected in series. In an inspection program for an assembled battery having a plurality of energy storage devices connected in series, based on a voltage difference between a first energy storage device with the first-lowest voltage and a second energy storage device with the second-lowest voltage during charge or during discharge among the plurality of energy storage devices, a computer is caused to perform detection processing for detecting an abnormality of the first energy storage device.

(12) The concept of the present technique can be applied to a recording medium in which an inspection program for an assembled battery having a plurality of energy storage devices connected in series is recorded. The recording medium may be any medium so long as being capable of recording an inspection program and may be a compact disc read-only memory (CD-ROM) and the like in addition to a memory.

DESCRIPTION OF REFERENCE SIGNS

2: secondary battery (energy storage device)
40: assembled battery
50: measuring unit
51: current measurement part
53: voltage measurement part
100: inspection apparatus
110: processor
120: memory (recording medium)
130: display

The invention claimed is:

1. An inspection apparatus for an assembled battery including a plurality of energy storage devices connected in series, the inspection apparatus comprising:
   a processor; and
   a memory, the memory storing instructions to cause the processor to detect, from among the energy storage devices, an internal short circuit of a first energy storage device with a first-lowest voltage based on a voltage difference between the first energy storage device and a second energy storage device with a second-lowest voltage during charge or discharge of the energy storage devices.

2. The inspection apparatus according to claim 1, wherein the first energy storage device is determined to be abnormal when the abnormality of the first energy storage device is detected both during charge and during discharge.

3. The inspection apparatus according to claim 1, wherein the abnormality of the first energy storage device is detected based on a number of times that the voltage difference exceeds a first threshold value.

4. The inspection apparatus according to claim 1, wherein the assembled battery is used for a moving body.

5. The inspection apparatus according to claim 4, wherein the abnormality of the first energy storage device is detected during the discharge of the assembled battery.

6. The inspection apparatus according to claim 4, wherein the moving body comprises a ship.

7. The inspection apparatus according to claim 1, wherein a first detection method and a second detection method are performed, the first detection method being to detect the abnormality of the first energy storage device based on a number of times that the voltage difference exceeds a first threshold value, the second detection method being to detect the abnormality of the first energy storage device based on duration in which a time change amount of the voltage difference continues to exceed a second threshold value, and
   when the abnormality is detected by at least one of the first detection method and the second detection method, the first energy storage device is determined to be abnormal.

8. The inspection apparatus according to claim 1, wherein the abnormality of the first energy storage device is detected based on a duration in which a time change amount of the voltage difference continues to exceed a second threshold value.

9. The inspection apparatus according to claim 8, wherein the assembled battery is for stationary use.

10. An assembled battery system comprising:
    the inspection apparatus according to claim 1; and
    an assembled battery having a plurality of energy storage devices connected in series,
    wherein the assembled battery is inspected by the inspection apparatus.

11. The inspection apparatus according to claim 1, wherein, based on the detection of the internal short circuit, the memory further stores instructions to cause the processor to make a notification.

12. The inspection apparatus according to claim 1, further comprising a display,
    wherein, based on the detection of the internal short circuit, the memory further stores instructions to cause the processor to make a notification by displaying an error message on the display.

13. The inspection apparatus according to claim 1, wherein, based on the detection of the internal short circuit, the memory further stores instructions to cause the processor to stop the charge or the discharge of the energy storage devices.

14. An inspection method for an assembled battery including plurality of energy storage devices connected in series, the inspection method comprising:
    detecting, from among the energy storage devices, an internal short circuit of a first energy storage device with a first-lowest voltage based on a voltage difference between the first energy storage device and a second energy storage device with a second-lowest voltage during charge or during discharge of the energy storage devices.

15. An inspection program stored on a non-transitory computer readable medium for an assembled battery including a plurality of energy storage devices connected in series, the inspection program including instructions stored on a memory, the instructions executable by a processor to cause the processor to detect, from among the energy storage devices, an internal short circuit of a first energy storage device with a first-lowest voltage based on a voltage difference between the first energy storage device and a second energy storage device with a second-lowest voltage during charge or during discharge of the energy storage devices.

* * * * *